United States Patent
Inoue

(10) Patent No.: US 10,607,812 B2
(45) Date of Patent: Mar. 31, 2020

(54) MULTIPLE CHARGED PARTICLE BEAM WRITING APPARATUS, AND MULTIPLE CHARGED PARTICLE BEAM WRITING METHOD

(71) Applicant: NuFlare Technology, Inc., Yokohama-shi (JP)

(72) Inventor: Hideo Inoue, Miura-gun (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 16/199,472

(22) Filed: Nov. 26, 2018

(65) Prior Publication Data
US 2019/0198290 A1   Jun. 27, 2019

(30) Foreign Application Priority Data
Dec. 26, 2017   (JP) ................. 2017-248758

(51) Int. Cl.
*H01J 37/302*   (2006.01)
*H01J 37/04*   (2006.01)
(Continued)

(52) U.S. Cl.
CPC ........ *H01J 37/3023* (2013.01); *H01J 37/045* (2013.01); *H01J 37/147* (2013.01); *H01J 37/20* (2013.01); *H01J 37/3177* (2013.01); *H01J 2237/0435* (2013.01); *H01J 2237/1536* (2013.01); *H01J 2237/20214* (2013.01);
(Continued)

(58) Field of Classification Search
CPC .... H01J 37/3023; H01J 37/045; H01J 37/147; H01J 37/20; H01J 37/3177; H01J 2237/0435; H01J 2237/1536; H01J 2237/20214; H01J 2237/20228; H01J 2237/30488; H01J 2237/31774
USPC ......... 250/396 R, 397, 492.1, 492.2, 492.21, 250/492.22, 492.23, 492.3
See application file for complete search history.

(56) References Cited

U.S. PATENT DOCUMENTS 9,466,461 B2 * 10/2016 Iizuka ................. H01J 37/3045
9,966,229 B2 *  5/2018 Matsumoto ......... H01J 37/3007
(Continued)

FOREIGN PATENT DOCUMENTS

JP   2016-62939   4/2016

*Primary Examiner* — Nicole M Ippolito
(74) *Attorney, Agent, or Firm* — Oblon, McClelland, Maier & Neustadt, L.L.P.

(57) ABSTRACT

A multiple charged particle beam writing apparatus includes a rotatable shaping aperture array substrate, including plural openings, to form/shape multiple beams by letting portions of a charged particle beam individually pass through the plural openings, a data rotation correction circuitry to read writing data from a storage device, and generate pattern data, in which the entire figure pattern has been reversely rotated against a rotational deviation direction of an aperture array image by a rotational deviation amount of the aperture array image, using information on the rotational deviation amount of the aperture array image of the multiple beams on the target object caused by a residual error of rotation adjustment of the shaping aperture array substrate, and a blanking aperture array mechanism, rotatable with the shaping aperture array substrate, to provide individual blanking control of the multiple beams, based on the pattern data of the figure pattern reversely rotated.

10 Claims, 13 Drawing Sheets

(51) Int. Cl.
*H01J 37/317* (2006.01)
*H01J 37/20* (2006.01)
*H01J 37/147* (2006.01)

(52) U.S. Cl.
CPC ............ *H01J 2237/20228* (2013.01); *H01J 2237/30488* (2013.01); *H01J 2237/31774* (2013.01)

(56) References Cited

U.S. PATENT DOCUMENTS

| | | | | |
|---|---|---|---|---|
| 2003/0085360 A1* | 5/2003 | Parker | ............... | B82Y 10/00 250/396 R |
| 2011/0068276 A1* | 3/2011 | Kruit | ............... | B82Y 10/00 250/396 R |

* cited by examiner

MULTIPLE CHARGED PARTICLE BEAM WRITING APPARATUS, AND MULTIPLE CHARGED PARTICLE BEAM WRITING METHOD

CROSS-REFERENCE TO RELATED APPLICATION

This application is based upon and claims the benefit of priority from prior Japanese Patent Application No. 2017-248758 filed on Dec. 26, 2017 in Japan, the entire contents of which are incorporated herein by reference.

BACKGROUND OF THE INVENTION

Field of the Invention

Embodiments of the present invention relate to a multiple charged particle beam writing apparatus and a multiple charged particle beam writing method, and, for example, relate to a method for correcting a writing position of a pattern written while an aperture array mechanism for forming multiple beams has rotational deviation.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique, which intrinsically has excellent resolution, is used for writing or "drawing" a mask pattern on a mask blank with electron beams.

For example, as a known example of employing the electron beam writing technique, there is a writing apparatus using multiple beams. Since it is possible for multi-beam writing to irradiate multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system in order to reduce a mask image, and deflects the beam by a deflector to irradiate a desired position on a target object or "sample".

In the multiple beam writing apparatus, the arrangement angle of the mask for forming multiple beams and the blanking array apparatus located thereunder is adjusted mechanically. However, it is difficult to have zero arrangement angle error. Accordingly, there is a residual error which results in rotation error of a multi-beam image. It is conceivable to correct this rotation error by adjusting rotation of a multi-beam image by beam calibration using an optical system. However, since other parameters, such as an expansion/contraction error, x-y direction error, optical distortion (e.g., aberration), etc. which are generated in an image need to be corrected together with the rotation error, degree of freedom may be insufficient in the case of adjustment only by an optical system. In that case, the image rotation error due to the arrangement angle error of a mask (and blanking array apparatus) remains as a correction residual error of a written pattern. Moreover, in electron beam writing, dimension variation generated by phenomena, such as a proximity effect, also needs to be corrected. Although it is conceivable to correct these correction target components by dose modulation, if the amount of correction becomes large, the dose modulation width becomes larger in accordance with it. In multi-beam writing, the dose of each beam is controlled based on the irradiation time. However, since irradiation of multiple beams is carried out at the same time, the shot time per shot is rate-controlled based on the maximum irradiation time of each beam. Thus, when moving the stage continuously at a constant speed, the stage speed is defined by the speed which enables to perform irradiation of the maximum irradiation time in all the shots of multiple beams. Accordingly, the shot of the maximum irradiation time restricts the shot cycle and the stage speed. If the maximum irradiation time increases, the throughput of the writing apparatus decreases correspondingly to the increased time.

Although not with respect to error of arrangement angle adjustment, as for the case where beam arrangement specially having a rotation component exists in some portion of multiple beams, it is disclosed that the deflection direction for collectively deflection-scanning the multiple beams is selected and corrected not to exceed the rotational limit value of beam arrangement having no rotation component, and that writing data is changed in accordance with distortion due to the correction of the deflection direction (e.g., refer to Japanese Patent Application Laid-open No. 2016-062939).

BRIEF SUMMARY OF THE INVENTION

According to one aspect of the present invention, a multiple charged particle beam writing apparatus includes:

a storage device configured to store writing data defining pattern data on a figure pattern to be written;

a stage configured to be movable and to mount thereon a target object;

an emission source configured to emit a charged particle beam; a shaping aperture array substrate, in which a plurality of openings are formed, configured to be rotatable and to form and shape multiple beams by letting portions of the charged particle beam individually pass through a corresponding one of the plurality of openings;

a data rotation correction circuitry configured to read the writing data from the storage device, and, by using information on a rotational deviation amount of an aperture array image of the multiple beams on the target object caused by a residual error of rotation adjustment of the shaping aperture array substrate, to generate pattern data in which a whole of the figure pattern has been rotated in a reverse direction to a rotational deviation direction of the aperture array image by the rotational deviation amount of the aperture array image;

a blanking aperture array mechanism configured to provide individual blanking control of the multiple beams, based on the pattern data of the figure pattern having been rotated in the reverse direction, and to be rotatable with the shaping aperture array substrate; and a deflector configured to deflect the multiple beams which have passed through the blanking aperture array mechanism and whose aperture array image has a rotational deviation caused by the residual error of the rotation adjustment of the shaping aperture array substrate, to desired positions on the target object.

According to another aspect of the present invention, a multiple charged particle beam writing method includes:

reading writing data from a storage device which stores the writing data defining pattern data on a figure pattern to be written, and, by using information on a rotational deviation amount of an aperture array image of multiple beams on a target object caused by a residual error of rotation adjustment of a shaping aperture array substrate which is rotatable and forms the multiple beams, generating the pattern data in which a whole of the figure pattern has been rotated in a reverse direction to a rotational deviation direction of the aperture array image by the rotational deviation amount of the aperture array image;

performing individual blanking control of the multiple beams, based on the pattern data of the figure pattern having been rotated in the reverse direction, by using a blanking aperture array mechanism which is rotatable with the shaping aperture array substrate; and writing the figure pattern on the target object by deflecting the multiple beams which have passed through the blanking aperture array mechanism and whose aperture array image has a rotational deviation caused by the residual error of the rotation adjustment of the shaping aperture array substrate, to desired positions on the target object.

DETAILED DESCRIPTION OF THE INVENTION

Embodiments below describe an apparatus and method which can correct rotation error of a multi-beam image due to error of arrangement angle adjustment of a mask for forming multiple beams, while inhibiting decrease of throughput.

Embodiments below describe a configuration in which an electron beam is used as an example of a charged particle beam. The charged particle beam is not limited to the electron beam, and other charged particle beam such as an ion beam may also be used.

First Embodiment

Figure 1:
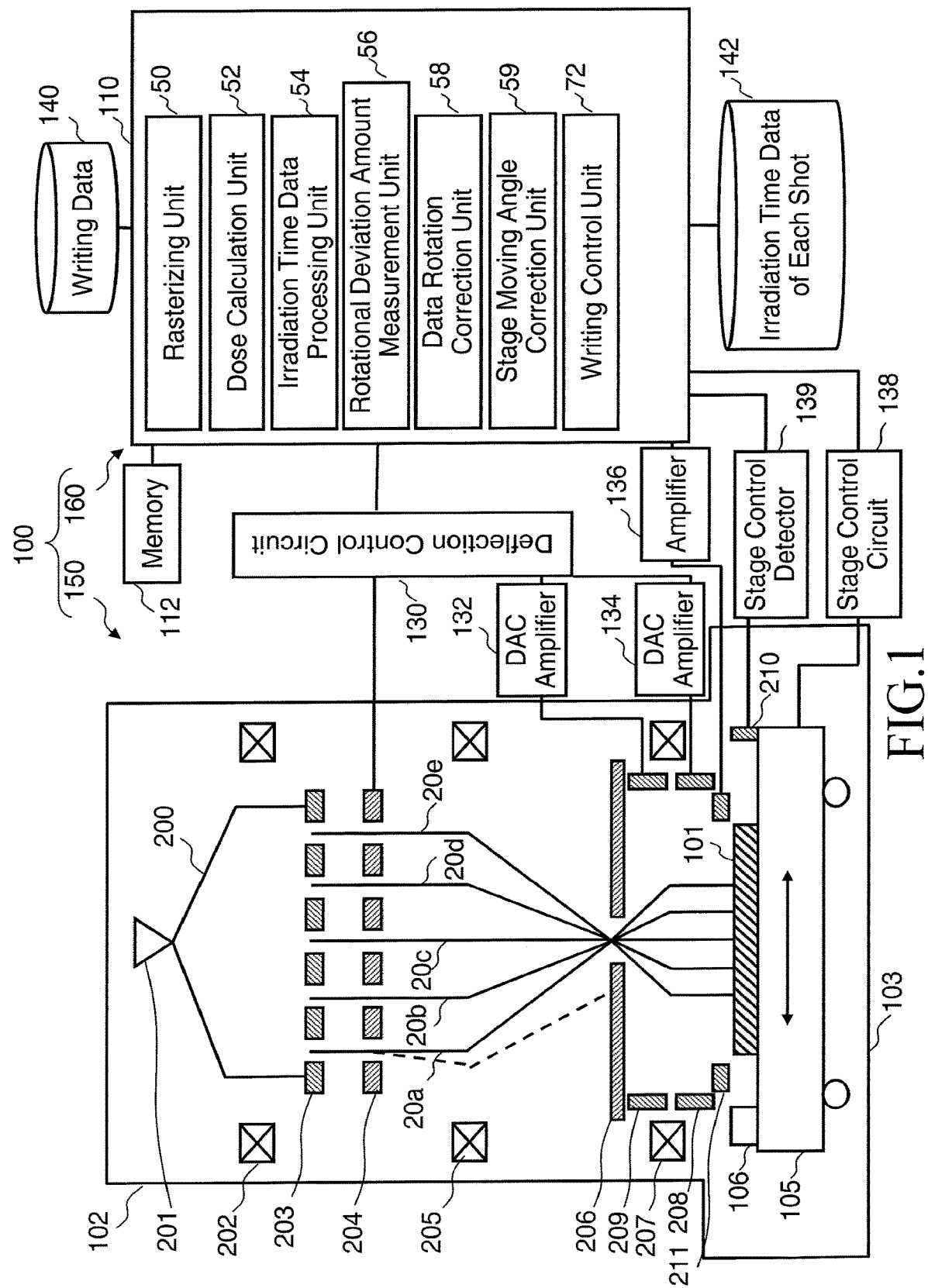
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multiple charged particle beam writing apparatus. The writing mechanism 150 includes an electron optical column 102 (multiple electron beam column) and a writing chamber 103. In the electron optical column 102, there are arranged an electron gun 201, an illumination lens 202, a shaping aperture array mechanism 203, a blanking aperture array mechanism 204, a reducing lens 205, a limiting aperture substrate 206, an objective lens 207, a deflector 208, a deflector 209, and a detector 211. In the writing chamber 103, there is arranged an XY stage 105. On the XY stage 105, a target object or "sample" 101 such as a mask blank, on which resist is applied, serving as a writing target substrate is placed when writing is performed. The target object 101 is, for example, an exposure mask used for fabricating semiconductor devices, or a semiconductor substrate (silicon wafer) for fabricating semiconductor devices. Moreover, a mirror 210 for measuring the position of the XY stage 105, and a mark 106 for measuring the position of multiple beams are arranged on the XY stage 105.

The control system circuit 160 includes a control computer 110, a memory 112, a deflection control circuit 130, digital-to-analog converting (DAC) amplifier units 132 and 134, an amplifier 136, a stage control circuit 138, a stage position detector 139, and storage devices 140 and 142, such as magnetic disk drives. The control computer 110, the memory 112, the deflection control circuit 130, the amplifier 136, the stage control circuit 138, the stage position detector 139, and the storage devices 140 and 142 are connected with each other through a bus (not shown). The deflection control circuit 130 is connected to the DAC amplifier units 132 and 134, and the blanking aperture array mechanism 204. Outputs of the DAC amplifier unit 132 are connected to the deflector 209. Outputs of the DAC amplifier unit 134 are connected to the deflector 208. The stage position detector 139 irradiates the mirror 210 on the XY stage 105 with a laser beam, and receives a reflected light from the mirror 210. Then, the stage position detector 139 measures the position of the XY stage 105 by using the principle of the laser interference based on information on the reflected light. Outputs from the detector 211 are connected to the amplifier 136. The amplifier 136 outputs information on a secondary electron including a reflected electron emitted as a result of scanning the mark 106 to be measured to the control computer 110.

In the control computer 110, there are arranged a rasterizing unit 50, a dose calculation unit 52, an irradiation time data processing unit 54, a rotational deviation amount measurement unit 56, a data rotation correction unit 58, a stage moving angle correction unit 59, and a writing control unit 72. Each of "... units" such as the rasterizing unit 50, the dose calculation unit 52, the irradiation time data processing unit 54, the rotational deviation amount measurement unit 56, the data rotation correction unit 58, the stage moving angle correction unit 59, and the writing control unit 72 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the rasterizing unit 50, the dose calculation unit 52, the irradiation time data processing unit 54, the rotational deviation amount measurement unit 56, the data rotation correction unit 58, the stage moving angle correction unit 59, and the writing control unit 72, and information being operated are stored in the memory 112 each time.

Moreover, writing data is input from the outside of the writing apparatus 100, and stored in the storage device 140. The writing data usually defines information on a plurality of figure patterns to be written. Specifically, it defines a figure code, coordinates of each vertex, etc. of each figure pattern.

FIG. 1 shows structure elements necessary for describing the first embodiment. It should be understood that other structure elements generally necessary for the writing apparatus 100 may also be included therein.

Figure 2:
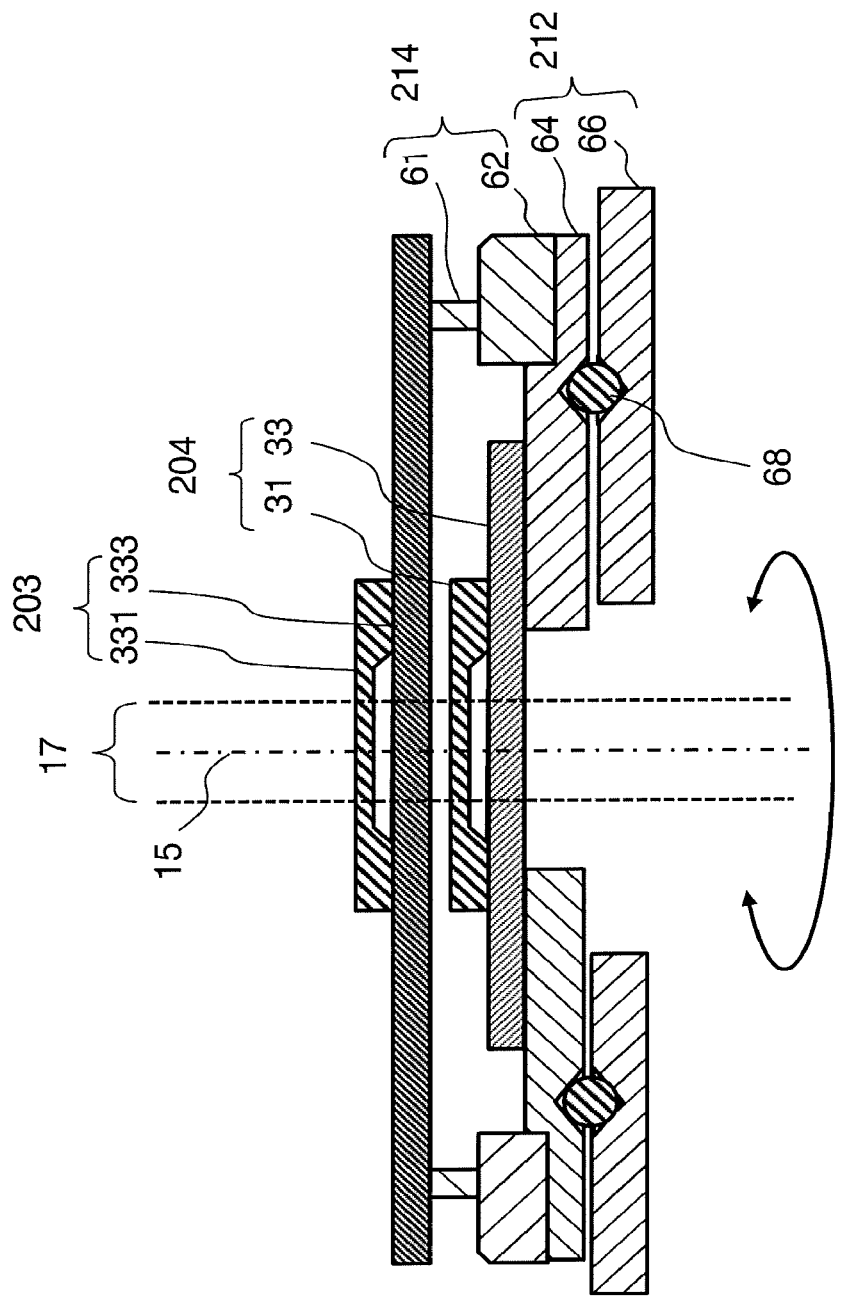
FIG. 2 is a sectional view showing an example of a blanking aperture stage mechanism according to the first embodiment.

FIG. 2 is a sectional view showing an example of a blanking aperture stage mechanism according to the first embodiment. As shown in FIG. 2, a rotary stage 64 is disposed on a fixed stage 66 in a blanking aperture stage mechanism 212. The rotary stage 64 is arranged on the fixed stage 66 through a ball bearing 68 so as to be rotatable. Then, the blanking aperture array mechanism 204 is placed on the rotary stage 64. The fixed stage 66 is disposed in the middle of the electron optical column 102 as being interposed between other component parts in the electron optical column 102. Each of the fixed stage 66 and the rotary stage 64 has an aperture wider than a passage region 17 of the multiple beams 20 at the center part centering on an optical axis 15 so that the multiple beams 20 can pass therethrough. Moreover, as shown in FIG. 2, a semiconductor substrate 31 made of silicon, etc. is disposed on a support table 33 in the blanking aperture array mechanism 204.

Furthermore, on the blanking aperture stage mechanism 212, a shaping aperture stage mechanism 214 is arranged. In the shaping aperture stage mechanism 214, a fixed stage 62 is disposed on the rotary stage 64 of the blanking aperture stage mechanism 212. The fixed stage 62 rotates centering on the optical axis 15 to be coincident with the rotation of the rotary stage 64 of the blanking aperture stage mechanism 212. A plurality of (e.g., three) support pillars 61 are arranged on the fixed stage 62, and the shaping aperture array mechanism 203 is arranged on a plurality of support pillars 61. As shown in FIG. 2, in the shaping aperture array mechanism 203, a shaping aperture array substrate 331 made of silicon, etc. is arranged on a support table 333. Therefore, the shaping aperture array mechanism 203 and the blanking aperture array mechanism 204 rotate integratedly to be coincident with the rotation of the rotary stage 64.

Figure 3:
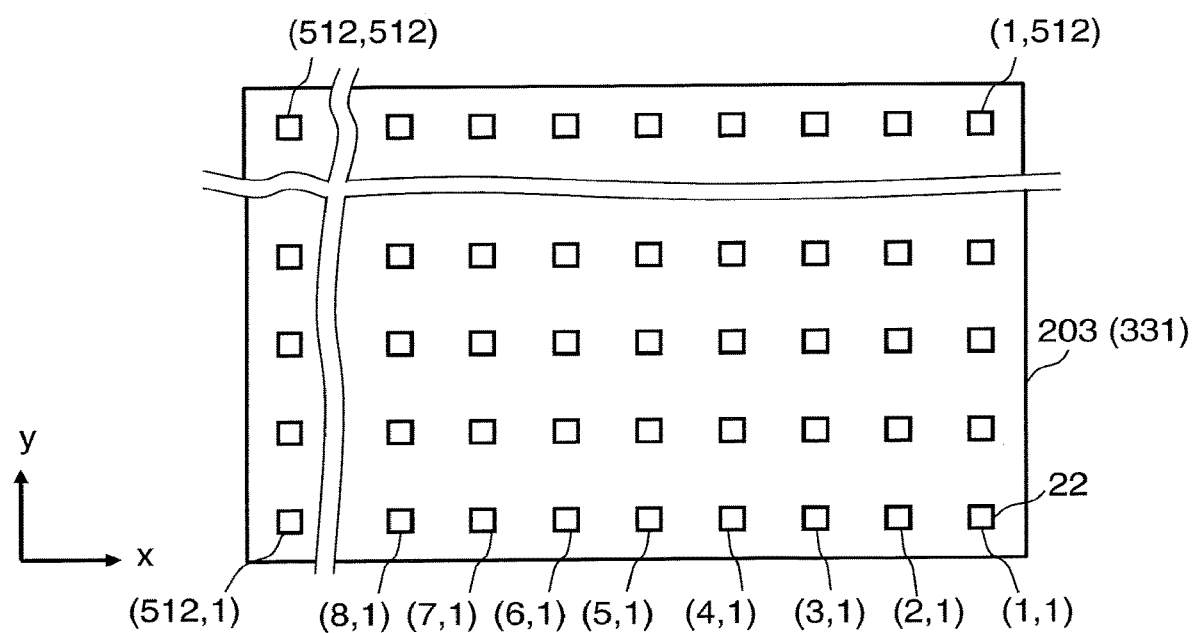
FIG. 3 is a conceptual diagram showing a configuration of a shaping aperture array substrate according to the first embodiment.

FIG. 3 is a conceptual diagram showing a configuration of a shaping aperture array substrate according to the first embodiment. As shown in FIG. 3, holes (openings, apertures) 22 of p rows long (length in the y direction) and q columns wide (width in x direction) ($p \geq 2$, $q \geq 2$) are formed, like a matrix, at a predetermined arrangement pitch in the shaping aperture array substrate 331 of the shaping aperture array mechanism 203. In FIG. 3, for example, holes 22 of 512 (rows of holes arrayed in y direction)×512 (columns of holes arrayed in x direction) are formed. Each of the holes 22 is a quadrangle (rectangle) having the same dimension and shape. Alternatively, each of the holes 22 may be a circle with the same diameter. By making portions of an electron beam 200 individually pass through a corresponding hole of a plurality of holes 22, multiple beams 20 are formed and each beam is shaped to be a desired shape. The method of arranging the holes 22 is not limited to the case of FIG. 3 where holes are arranged in a grid form in the length and width directions. For example, with respect to the kth and the (k+1)th rows which are arrayed (accumulated) in the length direction (y direction), each hole in the kth row and each hole in the (k+1)th row may be mutually displaced in the width direction (x direction) by a dimension "a". Similarly, with respect to the (k+1)th and the (k+2)th rows which are arrayed (accumulated) in the length direction (y direction), each hole in the (k+1)th row and each hole in the (k+2)th row may be mutually displaced in the width direction (x direction) by a dimension "b", for example.

Figure 4:
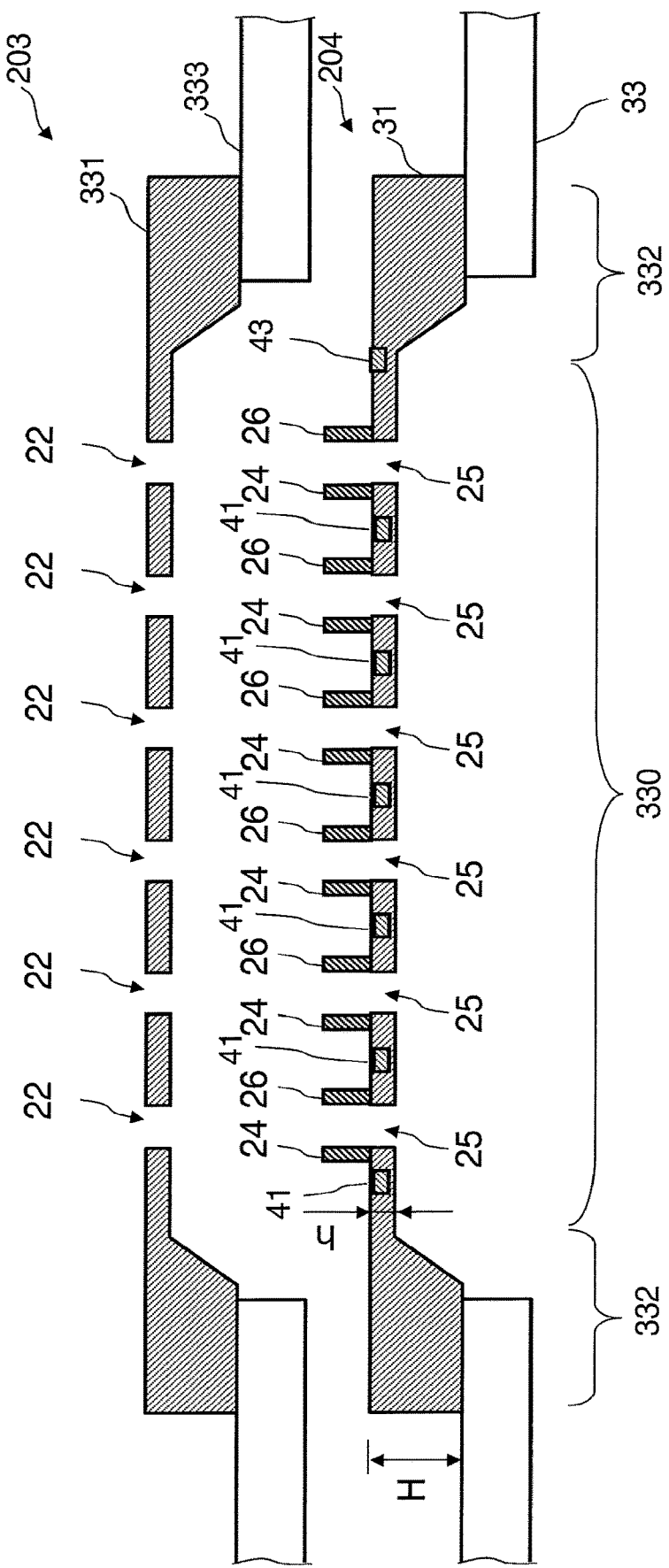
FIG. 4 is a sectional view showing each structure of a shaping aperture array mechanism and a blanking aperture array mechanism according to the first embodiment.

FIG. 4 is a sectional view showing each structure of a shaping aperture array mechanism and a blanking aperture array mechanism according to the first embodiment.

Figure 5:
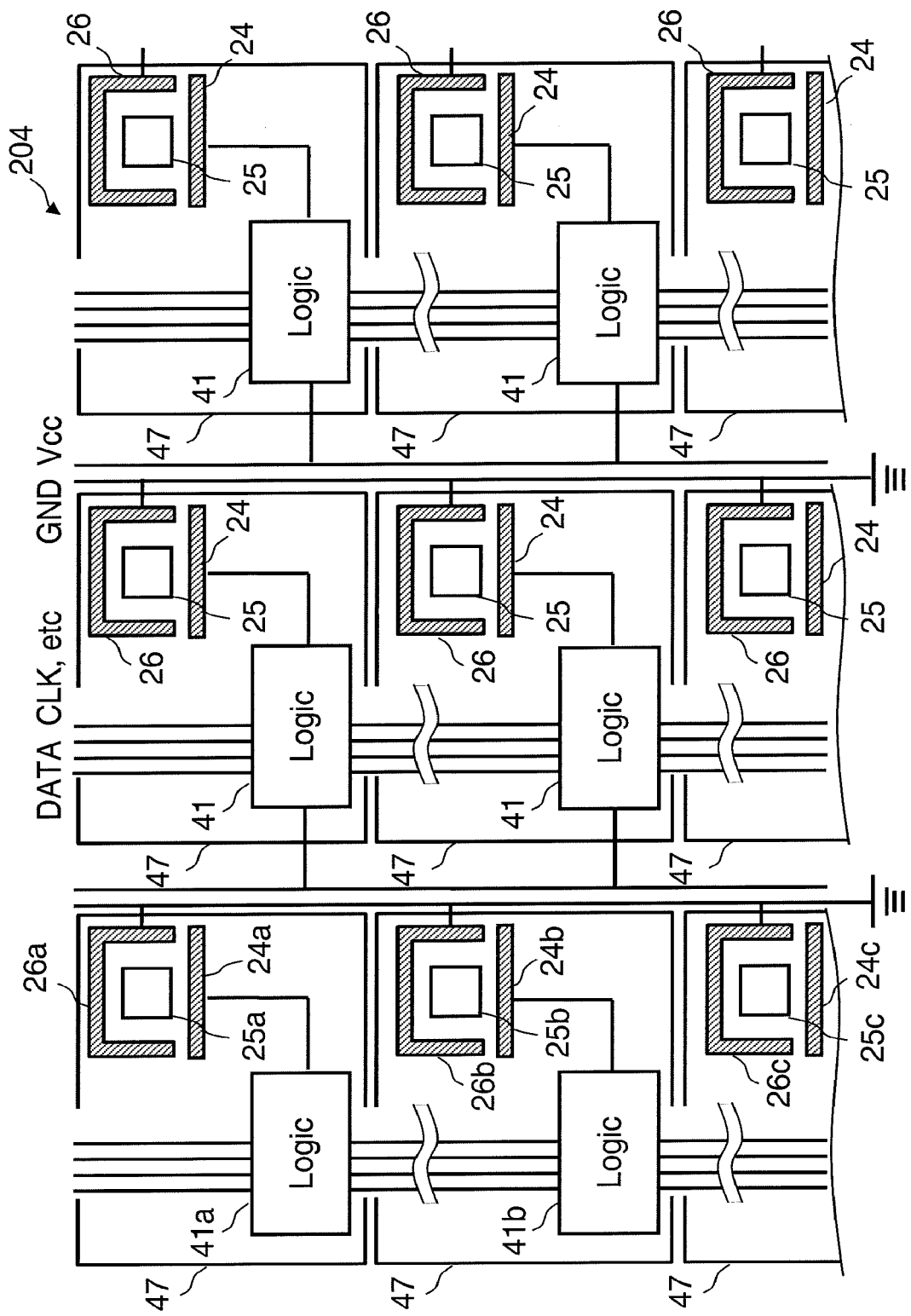
FIG. 5 is a top view conceptual diagram showing a portion of the structure in a membrane region of a blanking aperture array mechanism according to the first embodiment.

FIG. 5 is a top view conceptual diagram showing a portion of the structure in a membrane region of the blanking aperture array mechanism according to the first embodiment. The position relation of a control electrode 24, a counter electrode 26, a control circuit 41, and a pad 43 in FIG. 4 is not in accordance with that of FIG. 5. With regard to the structure of the shaping aperture array mechanism 203, as described above, the shaping aperture array substrate 331 made of silicon, etc. is placed on the support table 333. The central part of the substrate 331 is shaved from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the shaping aperture array substrate 331 is supported on the support table 333. The central part of the support table 333 is open, and the membrane region 330 is located at this opening region of the support table 333. Further, as shown in FIG. 3, a plurality of holes (opening) 22 are formed, like a matrix, at a predetermined arrangement pitch in the membrane region 330 of the shaping aperture array substrate 331.

Similarly, in the blanking aperture array mechanism 204, the semiconductor substrate 31 made of silicon, etc. is disposed on the support table 33. The central part of the substrate 31 is shaved from the back side, and made into the membrane region 330 (first region) having a thin film thickness h. The periphery surrounding the membrane region 330 is the outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region of the support table 33.

In the membrane region 330 of the substrate 31 of the blanking aperture array mechanism 204, passage holes 25 (openings) through each of which a corresponding one of multiple beams passes are formed at positions each corresponding to each hole 22 in the shaping aperture array substrate 331 shown in FIG. 3. In other words, in the membrane region 330 of the substrate 31, there are formed a plurality of passage holes 25 in an array through each of which a corresponding beam of electron multiple beams passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIGS. 4 and 5, each pair (blanker: blanking deflector) of the control electrode 24 and the counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 5, n-bit (e.g., 10-bit) parallel lines for control signals are connected to each control circuit 41. In addition to the n-bit parallel lines for controlling signals, lines for a clock signal, a read signal, a shot signal, a power supply, and the like are connected to each control circuit 41. Alternatively, a part of the parallel lines may be used as the lines for a clock signal, a read signal, a shot signal, a power supply, and the like. An individual blanking mechanism 47 composed of the control electrode 24, the counter electrode 26, and the control circuit 41 is configured for each of the multiple beams. In the example of FIG. 4, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped, for example, per row or per column, and the control circuits 41 in each group are connected in series as shown in FIG. 5. Then, the pad 43 arranged for each group sends a signal to the control circuits 41 in the group concerned. Specifically, a shift register (not shown) is arranged in each control circuit 41, and for example, shift registers in the control circuits 41 for beams in the same row in p×q multiple beams, for example, are connected in series. For example, control signals for beams in the same row in the p×q multiple beams are transmitted in series, and, for example, a control signal for each beam is stored in a corresponding control circuit 41 by p clock signals totally.

Figure 6:
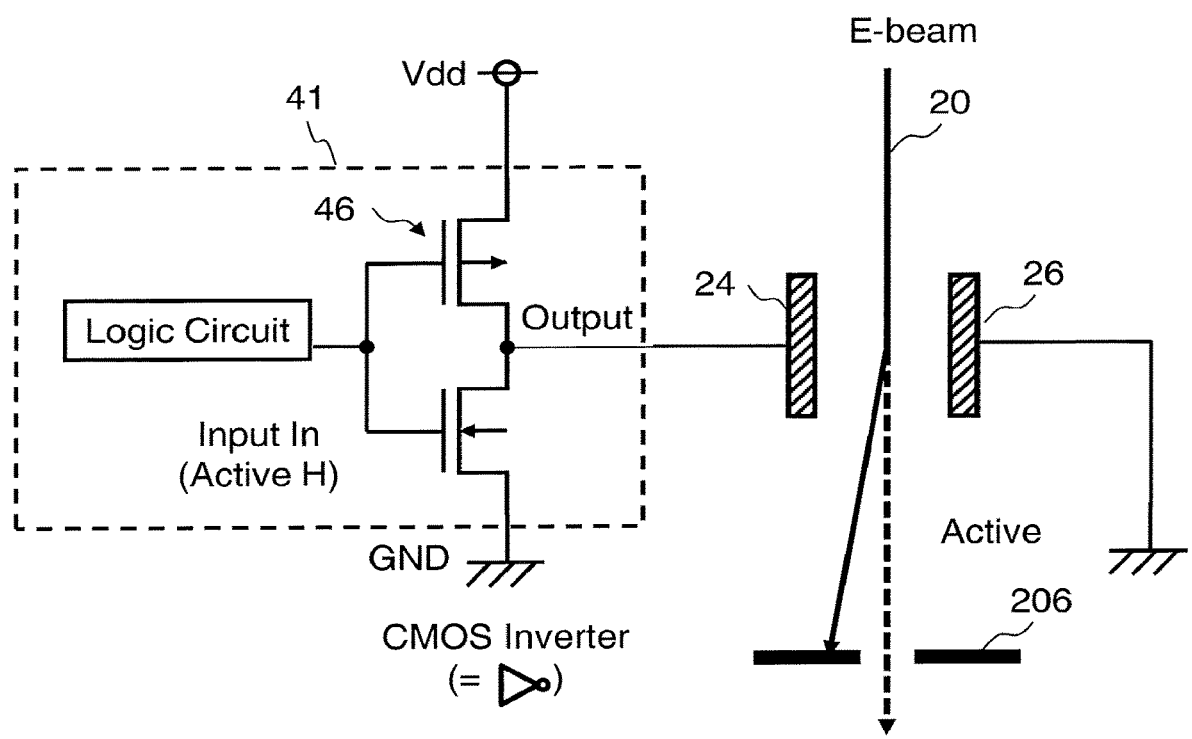
FIG. 6 shows an example of an individual blanking mechanism according to the first embodiment.

FIG. 6 shows an example of an individual blanking mechanism according to the first embodiment. As shown in FIG. 6, an amplifier 46 (an example of a switching circuit) is arranged in the control circuit 41. In the case of FIG. 6, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that each control electrode 24 and the corresponding counter electrode 26 are opposite to each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state where an L electric potential is applied to the input (IN) of the CMOS inverter circuit, the output (OUT) of the CMOS inverter circuit becomes a positive potential (Vdd), and then, a corresponding beam 20 is deflected by an electric field due to a potential difference from the ground potential of the counter electrode 26 so as to be blocked by the limiting aperture substrate 206, thereby being controlled to be in a beam OFF condition. On the other hand, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding beam 20 is not deflected, thereby being controlled to be in a beam ON condition by making the beam concerned pass through the limiting aperture substrate 206.

The electron beam 20 passing through a corresponding passage hole is deflected by a voltage independently applied to a pair of the control electrode 24 and the counter electrode 26. Blanking control is performed by this deflection. Specifically, a pair of the control electrode 24 and the counter electrode 26 individually provides blanking deflection of a corresponding beam of multiple beams by an electric potential switchable by the CMOS inverter circuit which serves as a corresponding switching circuit. Thus, each of a plurality of blankers performs blanking deflection of a corresponding beam in the multiple beams having passed through a plurality of holes 22 (openings) in the shaping aperture array substrate 331.

Figure 7:
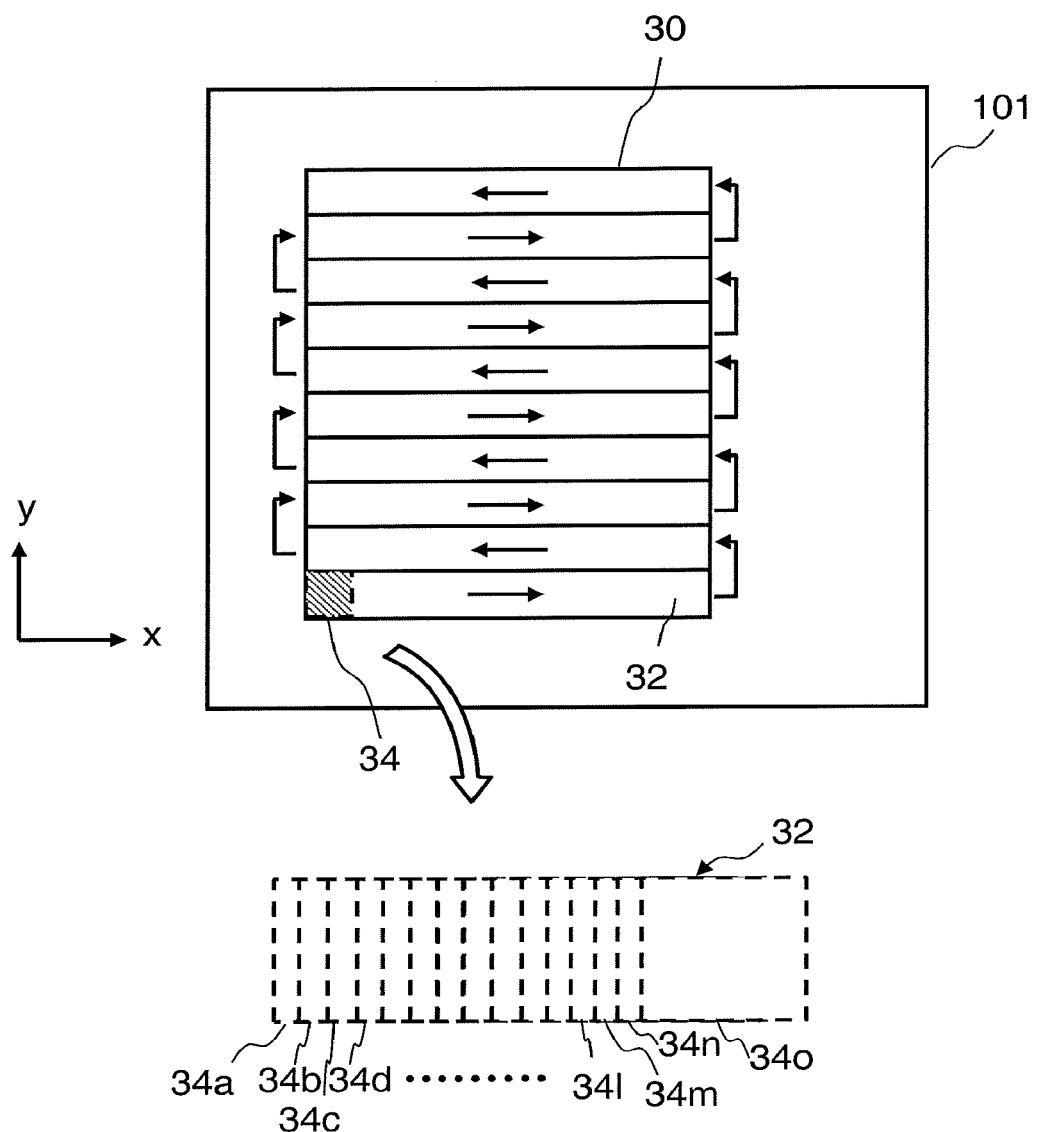
FIG. 7 is a conceptual diagram explaining an example of a writing operation according to the first embodiment.

FIG. 7 is a conceptual diagram explaining an example of a writing operation according to the first embodiment. As shown in FIG. 7, a writing region 30 (chip region) of the target object 101 is virtually divided by a predetermined width in the y direction into a plurality of stripe regions 32 in a strip form, for example. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing proceeds relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end and located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns up to as many as the number of the holes 22 are formed at a time by one shot of multiple beams having been formed by passing through the holes 22 in the shaping aperture array substrate 331.

Figure 8:
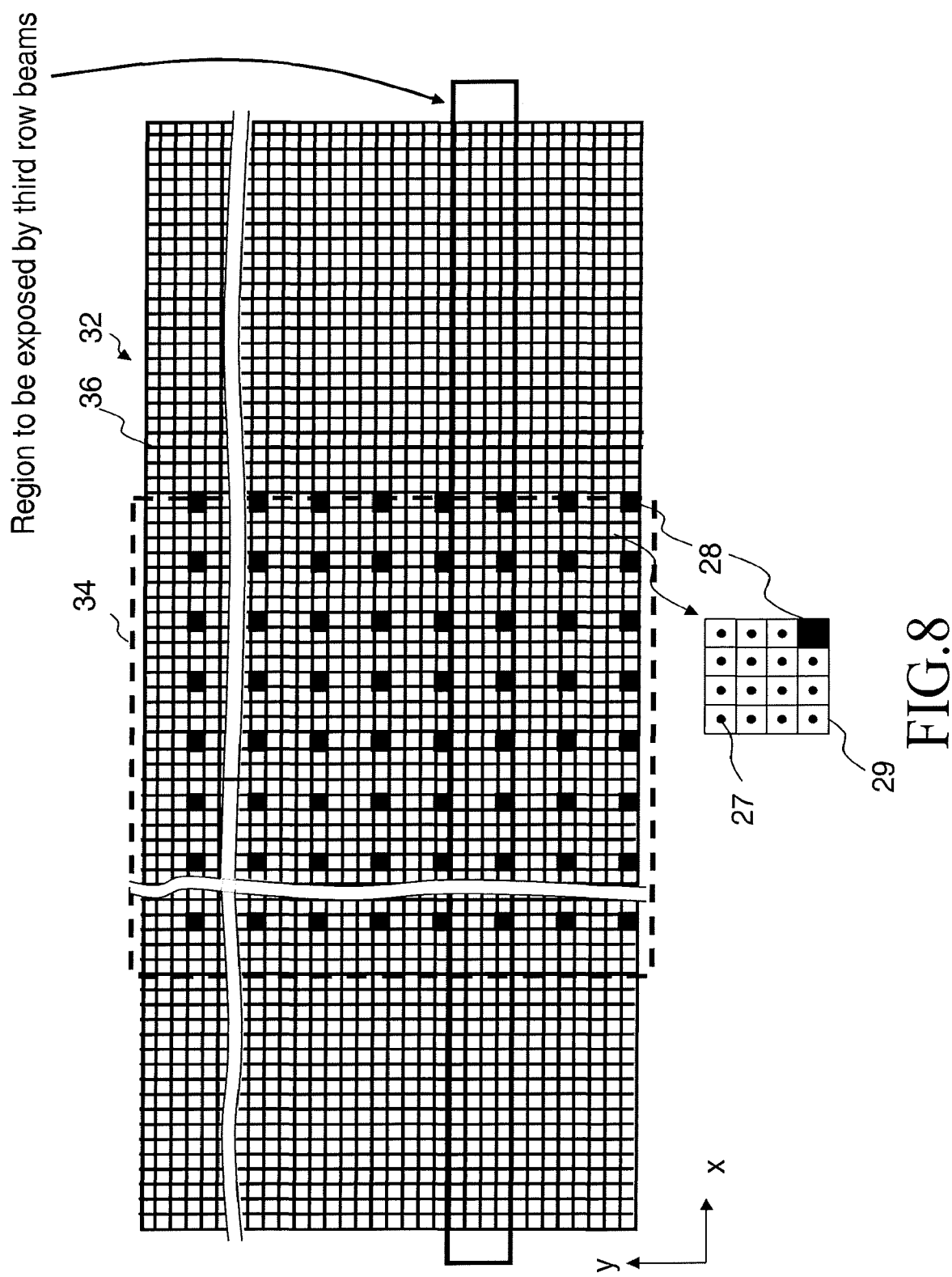
FIG. 8 shows an example of an irradiation region of multiple beams and a pixel to be written according to the first embodiment.

FIG. 8 shows an example of an irradiation region of multiple beams and a pixel to be written (writing target pixel) according to the first embodiment. In FIG. 8, in the stripe region 32, there are set a plurality of control grids 27 (design grids) arranged in a grid form at the beam size pitch of the multiple beams 20 on the surface of the target object 101, for example. Preferably, they are arranged at an arrangement pitch of around 10 nm. A plurality of control grids 27 serve as design irradiation positions of the multiple beams 20. The arrangement pitch of the control grid 27 is not limited to the beam size, and may be an arbitrary size which can be controlled as a deflecting position of the deflector 209, regardless of the beam size. Then, a plurality of pixels 36 obtained by virtually dividing into a mesh form by the same size as that of the arrangement pitch of the control grid 27 are set, each of which is centering on each control grid 27. Each pixel 36 serves as an irradiation unit region per beam of multiple beams. FIG. 8 shows the case where the writing region of the target object 101 is divided, for example, in the y direction, into a plurality of stripe regions 32 by the width size being substantially the same as the size of the irradiation region 34 (writing field) which can be irradiated with one irradiation of the multiple beams 20. The x-direction size of the irradiation region 34 can be defined by the value obtained by multiplying the pitch between beams in the x direction of the multiple beams 20 by the number of beams in the x direction. The y-direction size of the irradiation region 34 can be defined by the value obtained by multiplying the pitch between beams in the y direction of the multiple beams 20 by the number of beams in the y direction. The width of the stripe region 32 is not limited to this. Preferably, the width of the stripe region 32 is n times (n being an integer of 1 or greater) the size of the irradiation region 34. FIG. 8 shows the case of multiple beams of 512×512 (rows×columns) being simplified to 8×8 (rows×columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 8, one sub-irradiation region 29 is a square region surrounded by four adjacent pixels 28 at four corners and including one of the four pixels 28. In the case of FIG. 8, each sub-irradiation region 29 is composed of 4×4 pixels.

Figure 9:
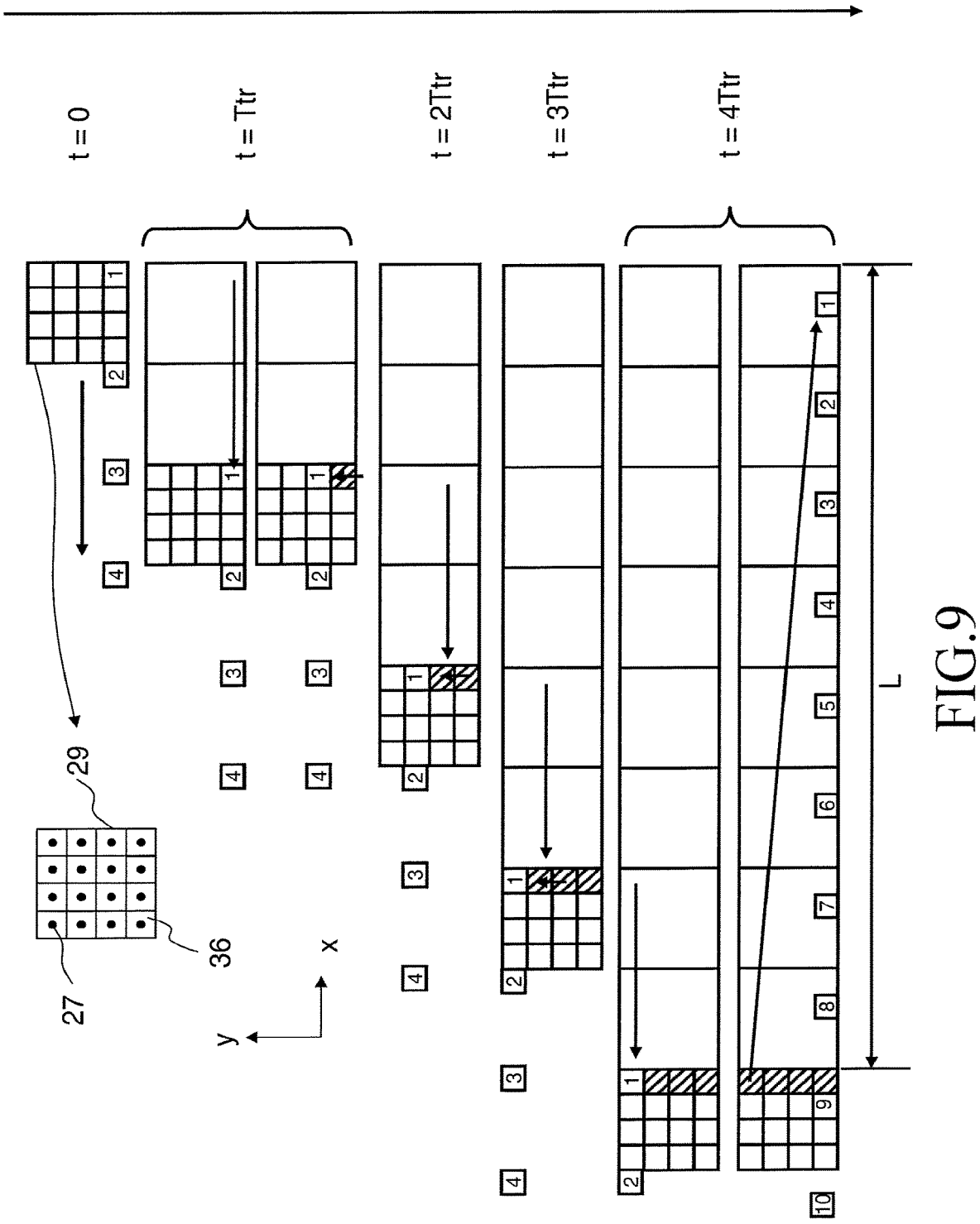
FIG. 9 illustrates an example of a writing method of multiple beams according to the first embodiment.

FIG. 9 illustrates an example of a writing method of multiple beams according to the first embodiment. FIG. 9 shows a part of the sub-irradiation region 29 to be written by respective beams at the coordinates (1, 3), (2, 3), (3, 3), . . . , (512, 3) in the third row from the bottom in the multiple beams for writing the stripe region 32 shown in FIG. 8. In the example of FIG. 9, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting all the multiple beams 20 by the deflector 208. In other words, tracking control is performed. In the case of FIG. 9, during one tracking cycle, four pixels are written (exposed) while moving the distance of eight beam pitches.

Specifically, the stage position detector 139 measures the position of the XY stage 105 by irradiating the mirror 210 with a laser and receiving a reflected light from the mirror 210. The measured position of the XY stage 105 is output to the control computer 110. In the control computer 110, the writing control unit 72 outputs the position information on the XY stage 105 to the deflection control circuit 130. While being in accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier unit 134. The DAC amplifier unit 134 converts the digital signal to an analog signal and amplifies it to be applied as a tracking deflection voltage to the deflector 208.

The writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each of the multiple beams of the shot concerned.

In the example of FIG. 9, the control grid 27 of the first pixel 36 from the right in the bottom row of the sub-irradiation region 29 concerned is irradiated with the first shot of the beam (1) at coordinates (1, 3) during the time from t=0 to t=maximum irradiation time Ttr, for example. Thereby, the pixel concerned has received beam irradiation of a desired irradiation time. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation of the shot concerned, while the beam deflection for tracking control is continuously performed by the deflector 208, the writing position (previous writing position) of each beam is shifted to a next writing position (current writing position) of each beam by collectively deflecting the multiple beams 20 by the deflector 209, which is performed in addition to the beam deflection for tracking control. In the example of FIG. 9, when the time becomes t=Ttr, the target control grid 27 to be written is shifted from the control grid 27 of the first pixel 36 from the right in the bottom row of the sub-irradiation region 29 concerned to the control grid 27 of the first pixel 36 from the right in the second row from the bottom. Since the XY stage 105 is moving at a fixed speed also during this time period, the tracking operation is continuously performed.

Then, while the tracking control is continuously performed, respective corresponding beams in the ON state in the multiple beams 20 are applied to the shifted writing positions corresponding to the respective beams during a writing time corresponding to each of the respective beams within the maximum irradiation time Ttr of the shot concerned. In the example of FIG. 9, the control grid 27 of the first pixel 36 from the right in the second row from the bottom of the sub-irradiation region 29 concerned is irradiated with the second shot of the beam (1) at the coordinates (1, 3) during the time from t=Ttr to t=2Ttr, for example. The XY stage 105 moves, for example, two beam pitches in the −x direction during the time from t=Ttr to t=2Ttr, for example. During this time period, the tracking operation is continuously performed.

In the example of FIG. 9, when the time becomes t=2Ttr, the target control grid 27 to be written is shifted from the control grid 27 of the first pixel 36 from the right in the second row from the bottom of the sub-irradiation region 29 concerned to the control grid 27 of the first pixel 36 from the right in the third row from the bottom by collective deflection of the multiple beams by the deflector 209. Since the XY stage 105 is moving also during this time period, the tracking operation is continuously performed. Then, the control grid 27 of the first pixel 36 from the right in the third row from the bottom of the sub-irradiation region 29 concerned is irradiated with the third shot of the beam (1) at the coordinates (1, 3) during the time from t=2Ttr to t=3Ttr, for example. Thereby, the control grid 27 of the pixel 36 concerned has received beam irradiation of a desired irradiation time.

The XY stage 105 moves two beam pitches in the −x direction during the time from t=2Ttr to t=3Ttr, for example. During this time period, the tracking operation is continuously performed. When the time becomes t=3Ttr, the target control grid 27 to be written is shifted from the control grid 27 of the first pixel 36 from the right in the third row from the bottom of the sub-irradiation region 29 concerned to the control grid 27 of the first pixel 36 from the right in the fourth row from the bottom by collectively deflecting the multiple beams by the deflector 209. Since the XY stage 105 is moving also during this time period, the tracking operation is continuously performed.

The control grid 27 of the first pixel 36 from the right in the fourth row from the bottom of the sub-irradiation region 29 concerned is irradiated with the fourth shot of the beam (1) at the coordinates (1, 3) during the time from t=3Ttr to t=4Ttr, for example. Thereby, the control grid 27 of the pixel 36 concerned has received beam irradiation of a desired irradiation time.

The XY stage 105 moves two beam pitches in the −x direction during the time from t=3Ttr to t=4Ttr, for example. During this time period, the tracking operation is continuously performed. In this manner, writing of the pixels in the first column from the right of the sub-irradiation region 29 concerned has been completed.

In the example of FIG. 9, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 9, when the time becomes t=4Ttr, tracking of the sub-irradiation region 29 concerned is cancelled, and the beam is swung back to a new sub-irradiation region 29 which has been shifted by eight beam pitches in the x direction. Although the beam (1) at the coordinates (1, 3) has been described in the example of FIG. 9, writing is also similarly performed for each sub-irradiation region 29 corresponding to a beam at other coordinates. That is, the beam at coordinates (n, m) completes writing of pixels in the first column from the right of a corresponding sub-irradiation region 29 when the time becomes t=4Ttr. For example, the beam (2) at coordinates (2, 3) completes writing of pixels in the first column from the right of the sub-irradiation region 29 adjacent in the −x direction to the sub-irradiation region 29 for the beam (1) of FIG. 9.

Since writing of the pixels in the first column from the right of each sub-irradiation region 29 has been completed, in a next tracking cycle after resetting the tracking, the deflector 209 performs deflection such that the writing position of each corresponding beam is adjusted (shifted) to the second pixel from the right in the first row from the bottom of each sub-irradiation region 29.

As described above, in the state where the relative position of the irradiation region 34 to the target object 101 is controlled by the deflector 208 to be an unchanged position during the same tracking cycle, each shot is performed while shifting one control grid 27 (pixel 36) by one control grid 27 (pixel 36) by the deflector 209. Then, after finishing one tracking cycle and returning the tracking position of the irradiation region 34, as shown in the lower part of FIG. 7, the shot position for the first shot is adjusted to the position shifted by one control grid (one pixel), for example, and each shot is performed shifting one control grid (one pixel) by one control grid (one pixel) by the deflector 209 while performing a next tracking control. By repeating this operation during writing the stripe region 32, the position of the irradiation region 34 is shifted one by one, such as from 34a to 34o, to perform writing of the stripe region concerned.

When writing the target object 101 with the multiple beams 20, as described above, irradiation is performed per control grid (one pixel) sequentially and continuously with multiple beams 20, serving as shot beams, by moving the beam deflection position by the deflector 209 while following the movement of the XY stage 105 during the tracking operation by the deflector 208. It is determined, based on the writing sequence, which beam of multiple beams irradiates which control grid 27 (pixel 36) on the target object 101. Then, the region obtained by multiplying the beam pitch (x direction) by the beam pitch (y direction), where the beam pitch is between beams adjacent in the x or y direction of multiple beams on the surface of the target object 101, is configured by a region (sub-irradiation region 29) composed of n×n pixels. For example, when the XY stage 105 moves in the −x direction by the distance of the beam pitch (x direction) by one tracking operation, as described above, n control grids (n pixels) are written in the y direction by one beam while the irradiation position is shifted. Alternatively, n control grids (n pixels) may be written in the x direction or diagonal direction by one beam while the irradiation position is shifted. Then, by the next tracking operation, other n pixels in the same n×n pixel region are similarly written by a different beam from the one used above. Thus, writing is performed for each n pixels by a different beam each time in n tracking operations, thereby writing all the pixels in one region of n×n pixels. With respect also to other regions each composed of n×n pixels in the irradiation region of multiple beams, the same operation is executed at the same time so as to perform writing similarly.

Next, operations of the writing mechanism 150 of the writing apparatus 100 will be described. The electron beam 200 emitted from the electron gun 201 (emission source) almost perpendicularly (e.g., vertically) illuminates the whole of the shaping aperture array substrate 331 by the illumination lens 202. A plurality of quadrangular holes (openings) are formed in the shaping aperture array substrate 331. The region including all the plurality of holes is irradiated with the electron beam 200. For example, a plurality of quadrangular electron beams (multiple beams) 20a to 20e are formed by letting portions of the electron beam 200, which irradiates the positions of a plurality of holes, individually pass through a corresponding hole of the plurality of holes of the shaping aperture array substrate 331. The multiple beams 20a to 20e individually pass through corresponding blankers (first deflector: individual blanking mechanism) of the blanking aperture array mechanism 204. Each blanker deflects (provides blanking deflection) the electron beam 20 which is individually passing.

The multiple beams 20a to 20e having passed through the blanking aperture array mechanism 204 are reduced by the reducing lens 205, and go toward the hole in the center of the limiting aperture substrate 206. At this stage, the electron beam 20a which was deflected by the blanker of the blanking aperture array mechanism 204 deviates (shifts) from the hole in the center of the limiting aperture substrate 206 and is blocked by the limiting aperture substrate 206. On the other hand, the electron beams 20b to 20e which were not deflected by the blanker of the blanking aperture array mechanism 204 pass through the hole in the center of the limiting aperture substrate 206 as shown in FIG. 1. Blanking control is provided by ON/OFF of the individual blanking mechanism so as to control ON/OFF of beams. Thus, the limiting aperture substrate 206 blocks each beam which was deflected to be in the OFF state by the individual blanking mechanism 47. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams (the whole of the multiple beams 20) having passed through the limiting aperture substrate 206 are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes of the shaping aperture array substrate 331 by a desired reduction ratio described above.

Now, in order to individually provide blanking deflection of multiple beams formed by the shaping aperture array mechanism 203 as described above, it is important to adjust so that each of a plurality of holes 22 of the shaping aperture array mechanism 203 and each of a plurality of passage holes 25 of the blanking aperture array mechanism 204 may be located on the trajectory of each corresponding beam of the multiple beams. Therefore, before writing processing (at the time of starting-up the apparatus), first, the shaping aperture array mechanism 203 is rotated so that each hole 22 formed in the shaping aperture array substrate 331 may fit the position of the corresponding passage hole 25 (opening) of the blanking aperture stage mechanism 212, and then, while maintaining this positional state after rotation, the shaping aperture array mechanism 203 is arranged on a plurality of support pillars 61. Alternatively, in the state where the shaping aperture array mechanism 203 has been arranged on a plurality of support pillars 61, the fixed stage 62 is rotated so that each hole 22 formed in the shaping aperture array substrate 331 may fit the position of the corresponding passage hole 25 (opening) of the blanking aperture stage mechanism 212, and then, the fixed stage 62 is arranged on the rotary stage 64 of the blanking aperture stage mechanism 212. Hereafter, the arrangement angle of the shaping aperture array mechanism 203 and the blanking aperture stage mechanism 212 is integratedly adjusted by the rotation of the rotary stage 64. In other words, the shaping aperture array substrate 331 (shaping aperture array mechanism 203) is rotation-adjustably arranged. Similarly, the blanking aperture array mechanism 204 is rotation-adjustably arranged with the shaping aperture array substrate 331.

However, it is difficult to have zero rotation error with respect to a multi-beam image on the target object 101 by mechanically performing adjustment of the arrangement angle by rotation of the rotary stage 64. On the other hand, parameters, such as an expansion/contraction error, x-y direction error, optical distortion (e.g., aberration), etc. generated in a multi-beam image are adjusted by beam calibration using an optical system. As described above, if correction is performed for rotation error of a multi-beam image in addition to the correction of parameters, such as an expansion/contraction error, x-y direction error, optical distortion (e.g., aberration), etc., degree of freedom may be insufficient in the case of adjustment only by an optical system. In that case, image rotation error due to arrangement angle error of the shaping aperture array mechanism 203 and the blanking aperture stage mechanism 212 remains as a correction residual error of a written pattern. As described above, in electron beam writing, dimension variation generated by phenomena, such as a proximity effect, also needs to be corrected. Although it is conceivable to correct these correction target components by dose modulation, if the amount of correction becomes large, the dose modulation width becomes larger in accordance with it. Then, if the dose modulation width becomes larger, the maximum irradiation time in all the shots of multiple beams becomes longer. As described above, since the shot of the maximum irradiation time restricts the shot cycle and the stage speed, if the maximum irradiation time increases, throughput of the writing apparatus decreases correspondingly to the increased time. Then, according to the first embodiment, writing position deviation resulting from rotation error of a multi-beam image is cancelled out by rotation correction in writing data, and correction of moving direction of the XY stage 105. It will be specifically described below.

Figure 10:
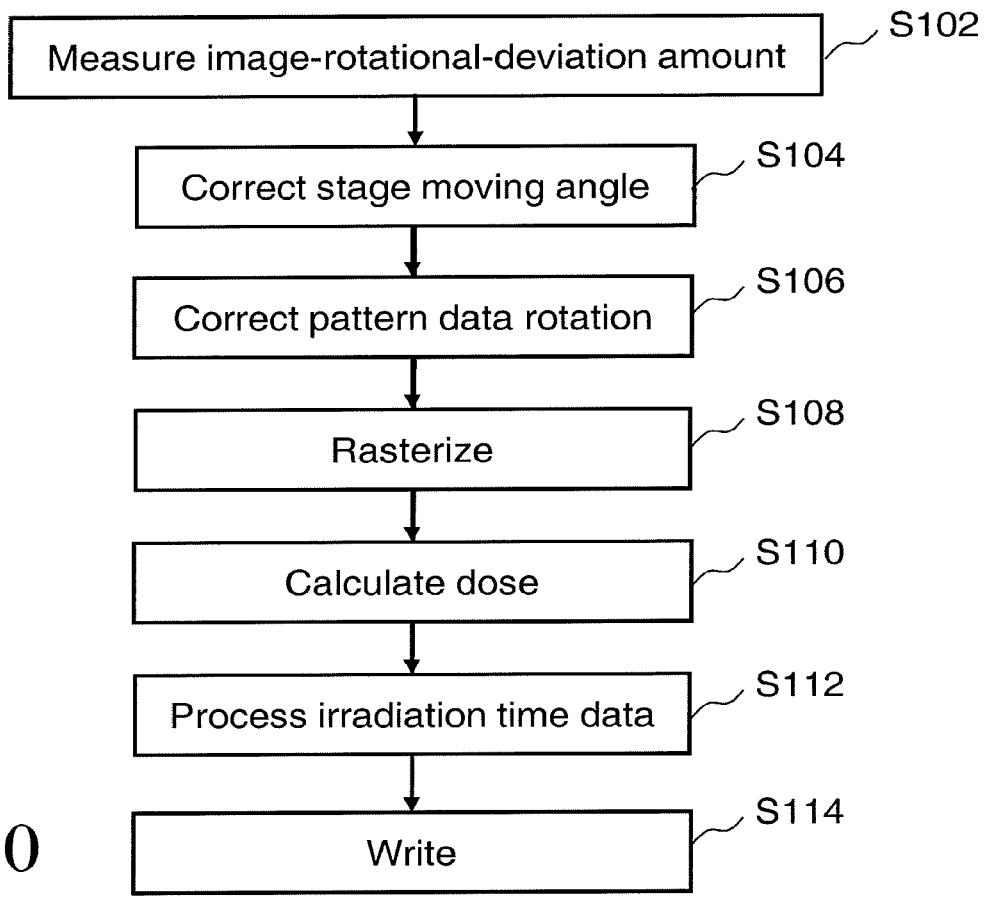
FIG. 10 is a flowchart showing main steps of a writing method according to the first embodiment.

FIG. 10 is a flowchart showing main steps of a writing method according to the first embodiment. In FIG. 10, the writing method of the first embodiment executes a series of steps: an image-rotational-deviation amount measuring step (S102), a stage moving angle correcting step (S104), a pattern data rotation correcting step (S106), a rasterizing step (S108), a dose calculating step (S110), an irradiation time data processing step (S112), and a writing step (S114).

In the image-rotational-deviation amount measuring step (S102), the rotational deviation amount measurement unit 56 measures a rotational deviation amount of an aperture array image (multi-beam image) of the multiple beams 20 on the target object 101 which is caused by a rotation adjustment error of the blanking aperture array mechanism 204, that is a residual error of rotation adjustment of the shaping aperture array substrate 331. Specifically, it operates as follows: The writing control unit 72 first selects beams 11 atone of the four corners of a circumscribed rectangle 13 of an aperture array image formed by pxq multiple beams 20, and moves the XY stage 105 such that the mark 106 on the XY stage 105 is located at the position relative to that one corner in the irradiation region 34 of the multiple beams 20. Then, the writing control unit 72 outputs a control signal to the deflection control circuit 130 so that the beams 11 near that one corner may be in a "beam-ON" condition and the other remaining beams may be in a "beam OFF" condition. Under the control of the deflection control circuit 130, the blanking aperture array mechanism 203 controls each blanker so that the beams 11 of one selected corner may be in a "beam-ON" condition and the other remaining beams may be in a "beam OFF" condition. For example, if the multiple beams 20 is composed of 512×512 beams, beams 11 close to one of the four corners, that is the beams 11 being 10×10 beams, for example, are set to be in a "beam-ON" condition, and the other remaining beams are set to be in a "beam OFF" condition. Then, the mark 106 on the XY stage 105 is scanned by collectively deflecting the 10×10 beams 11 close to that one corner by the deflector 208, for example. Through this scanning, the detector 211 detects secondary electrons (reflected electrons may be included) emitted from the stage surface or the mark 106. Data detected by the detector 211 is amplified by the amplifier 136, converted into digital data from analog data, and output to the rotational deviation amount measurement unit 56. Moreover, position information on the XY stage 105 is output to the rotational deviation amount measurement unit 56 from the stage position detector 139. Also, similar operations are performed for the other three remaining corners.

Figure 11:
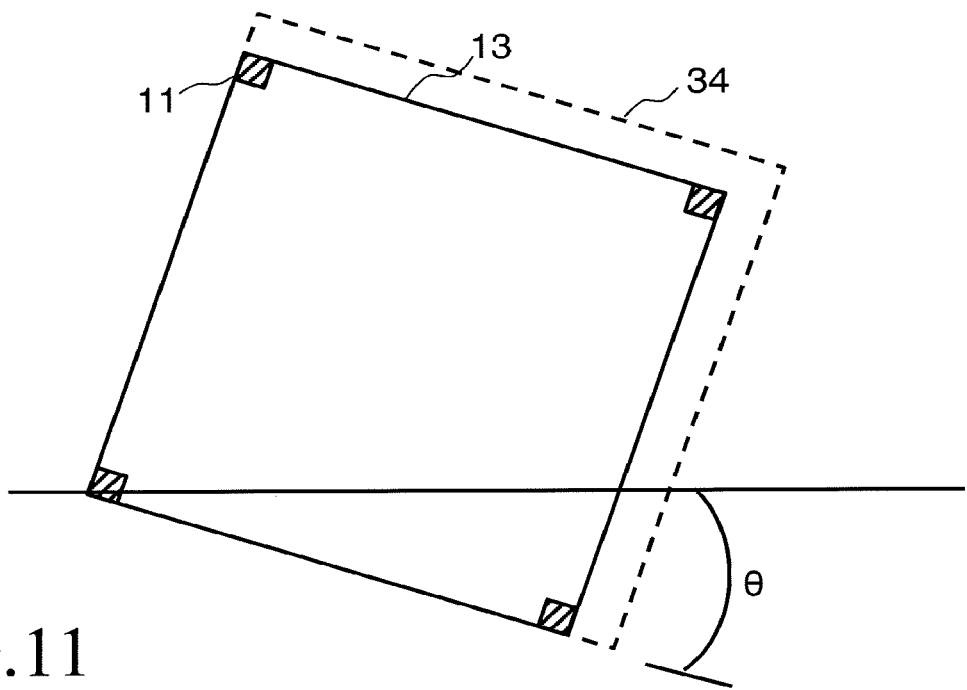
FIG. 11 illustrates an example of a method for measuring a rotation error of a multi-beam image according to the first embodiment.

FIG. 11 illustrates an example of a method for measuring a rotation error of a multi-beam image according to the first embodiment. The rotational deviation amount measurement unit 56 measures, using input detected data, the position of the beams 11 of each of the four corners of a multi-beam image. By measuring the positions of the four corners of the circumscribed rectangle 13, it becomes possible to calculate a rotation error θ of the circumscribed rectangle 13. The rotation error θ of the circumscribed rectangle 13 is equivalent to the rotational deviation amount of the aperture array image (multi-beam image) on the surface of the target object 101, and furthermore, equivalent to the rotational deviation amount of the irradiation region 34 of the multiple beams 20.

In the stage moving angle correcting step (S104), the stage moving angle correction unit 59 corrects the moving angle of the XY stage 105 in the case of writing each stripe region 32.

Figure 12A:
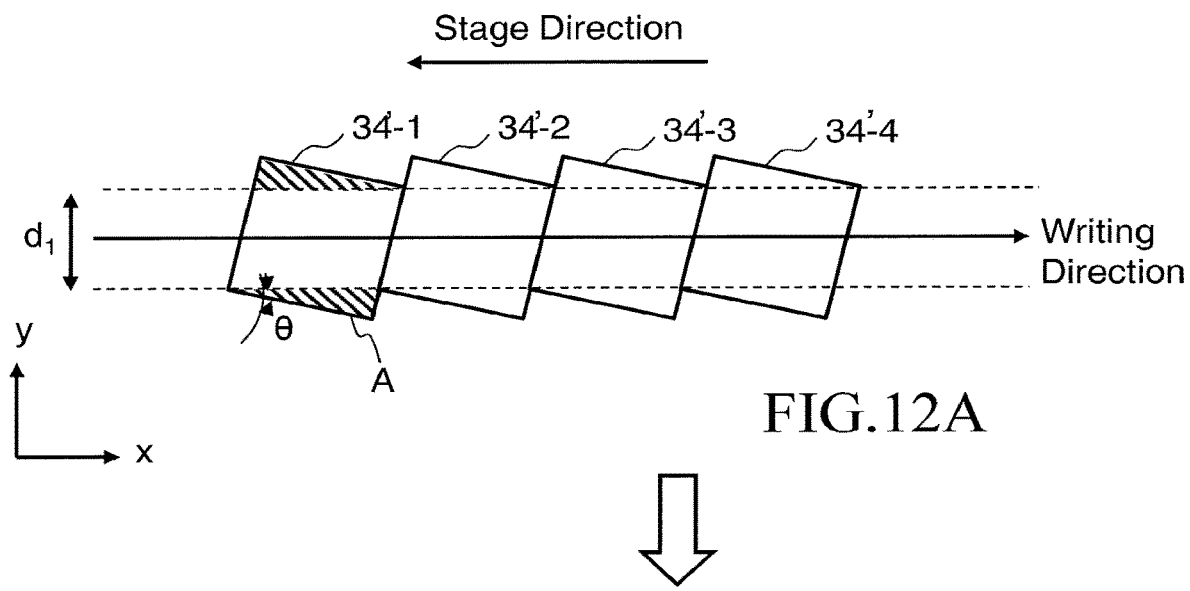
FIGS. 12A and 12B show relation between a rotation error and a writing direction of a multi-beam image according to the first embodiment.
Figure 12B:
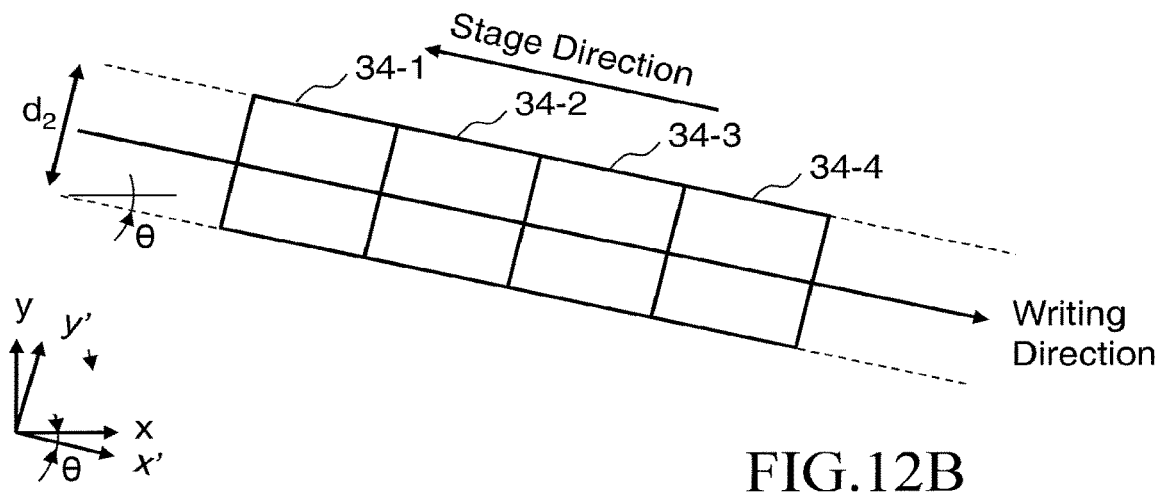

FIGS. 12A and 12B show relation between a rotation error and a writing direction of a multi-beam image according to the first embodiment. FIGS. 12A and 12B show cases where, due to a rotation adjustment error of the blanking aperture array mechanism 204, in other words, due to a residual error of rotation adjustment of the shaping aperture array substrate 331, there is generated a rotational deviation amount θ against the conventional writing direction (x direction), in the aperture array image (multi-beam image) on the surface of the target object 101 of the multiple beams 20. When the XY stage 105 moves in the −x direction, the irradiation region 34 of the multiple beams 20 relatively goes in the x direction. In that case, as shown in FIG. 12A, if the rotational deviation amount θ has occurred against the writing direction (x direction) in the aperture array image (multi-beam image) on the surface of the target object 101, aperture array images (multi-beam images) each having the rotational deviation amount θ are aligned in the x direction on the surface of the target object 101 in the order of irradiation regions 34'-1, 34'-2, 34'-3, and 34'-4 while deviating (shifting) the position of the corner part between the irradiation region concerned and the adjacent irradiation region. In that case, a portion (named A) with respect to which beam irradiation cannot be continuously performed in the x direction is generated due to rotation of the image having the rotational deviation amount θ. Therefore, it is difficult for pattern formation to use a beam located in this portion (named A). Thus, since this portion (named A) cannot be used in the writing processing, the width $d_1$ of the stripe region 32 becomes narrow when forming the stripe region 32 in the y direction.

Then, according to the first embodiment, as shown in FIG. 12B, the writing direction is also deviated (shifted) by the angle θ in the x direction to be in accordance with the rotational deviation amount θ of the aperture array image (multi-beam image). In other words, the stage moving angle correction unit 59 corrects the x axis (first axis) and the y axis of the moving coordinate system of the XY stage 105, (that is the writing progressing coordinate system), to be x' axis (second axis) and the y' axis by performing rotation by the angle θ. Thereby, when the XY stage 105 moves in the −x' direction, the irradiation region 34 of the multiple beams 20 relatively goes in the x' direction (oblique direction) which is deviated from the conventional writing direction (x direction) by the angle θ. Therefore, aperture array images (multi-beam images) each having the rotational deviation amount θ are aligned in the x' direction on the surface of the target object 101. Accordingly, as shown in FIG. 12B, aperture array images (multi-beam images) each having the rotational deviation amount θ are aligned in the x' direction on the surface of the target object 101 in the order of irradiation regions 34'-1, 34'-2, 34'-3, and 34'-4 while the corner position of the irradiation region concerned and that of the adjacent irradiation region are made to be matched with each other. With this structure, there exists no portion (named A) with respect to which beam irradiation cannot be continuously performed in the x direction, and therefore, the width $d_2$ of the stripe region 32 can be wider than the width $d_1$ when forming the stripe region 32 in the y' direction. Information on the corrected moving coordinate system of the XY stage 105, (that is the writing progressing coordinate system), is output to the stage control circuit 138.

Figure 13A:
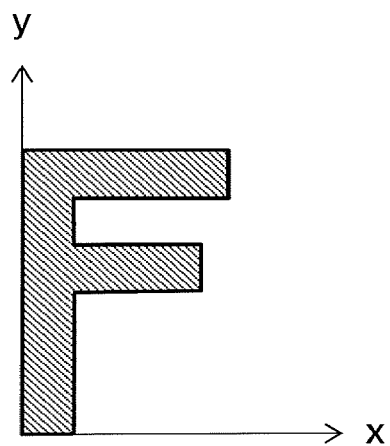
FIGS. 13A to 13D show examples of a pattern in the data coordinate system and a pattern formed on the target object according to the first embodiment and a comparative example.
Figure 13B:
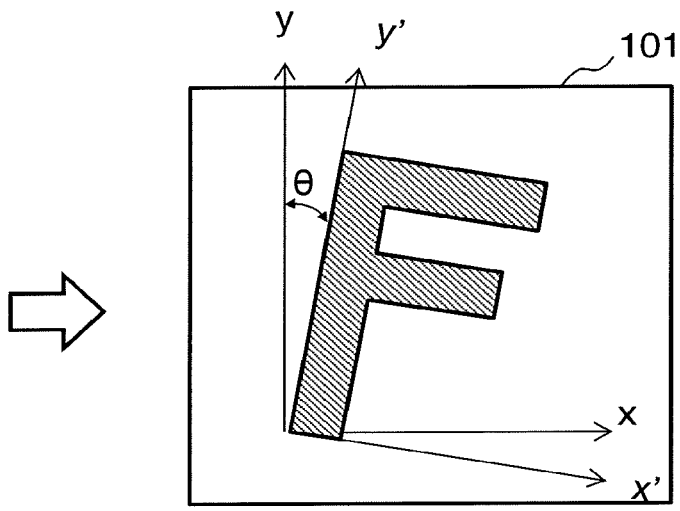
Figure 13C:
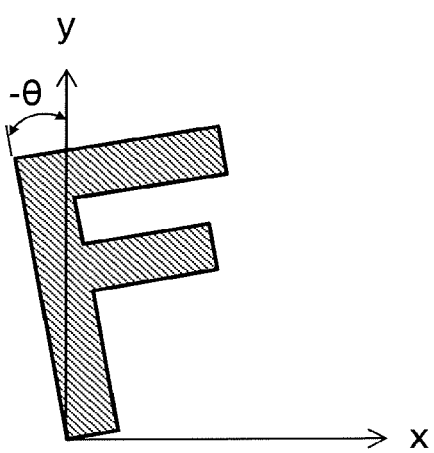
Figure 13D:
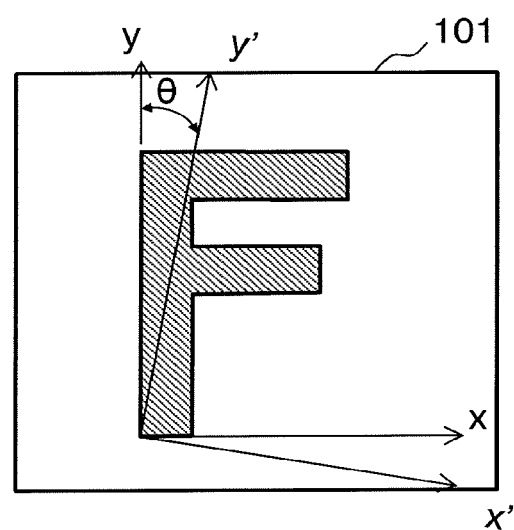

FIGS. 13A to 13D show examples of a pattern in the data coordinate system and a pattern formed on the target object according to the first embodiment and a comparative example. As shown in FIG. 13A, the writing data which is input into the writing apparatus 100 and stored in the storage device 140 is generated along the x and y axes of the data coordinate system. However, as described above, due to a rotation adjustment error of the blanking aperture array mechanism 204, in other words, due to a residual error of rotation adjustment of the shaping aperture array substrate 331, there is generated the rotational deviation amount θ against the x axis, in the aperture array image (multi-beam image) on the surface of the target object 101 of the multiple beams 20. In this state, in a comparative example, a pattern (F) defined by the writing data, as it is, is written on the target object 101. As the result, as shown in FIG. 13B, the pattern (F) formed (written) on the target object 101 has the shape rotated by the rotational deviation amount θ. Even when the XY stage 105 moves in a diagonal direction as described in FIG. 12B, the formed pattern (F) similarly has the shape rotated by the rotational deviation amount θ. On the other hand, in the case shown in FIG. 13C, the pattern is rotated in the direction opposite to the rotational deviation direction of the aperture array image by the rotational deviation amount θ with respect to the x and y axes of the data coordinate system, (that is the pattern is rotated by −θ). Then, the pattern (F) having been rotated (corrected) by −θ is written on the target object 101. As the result, as shown in FIG. 13D, the pattern (F) written on the target object 101 has a shape in which the rotational deviation amount θ has been corrected. Even when the XY stage 105 moves in a diagonal direction as described in FIG. 12B, the formed pattern (F) similarly has a shape in which the rotational deviation amount θ has been corrected as shown in FIG. 13D. Then, according to the first embodiment, the pattern defined by the writing data is beforehand, namely before writing, rotated in the reverse direction.

In the pattern data rotation correcting step (S106), the data rotation correction unit 58 reads writing data from the storage device 140 in order to generate pattern data. Specifically, using information on the rotational deviation amount θ of the aperture array image of the multiple beams 20 on the target object 101, caused by a residual error of rotation adjustment of the shaping aperture array substrate 331, the data rotation correction unit 58 generates pattern data in which the whole figure pattern has been rotated in the direction reverse to the rotational deviation direction of the aperture array image by the rotational deviation amount θ of the aperture array image. According to the first embodiment, rotation correction is performed in the pattern data at the stage before performing rasterizing processing.

Figure 14A:
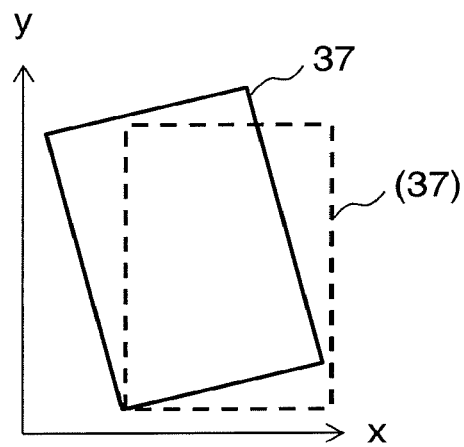
FIGS. 14A to 14C show states of chip regions at respective stages according to the first embodiment.
Figure 14B:
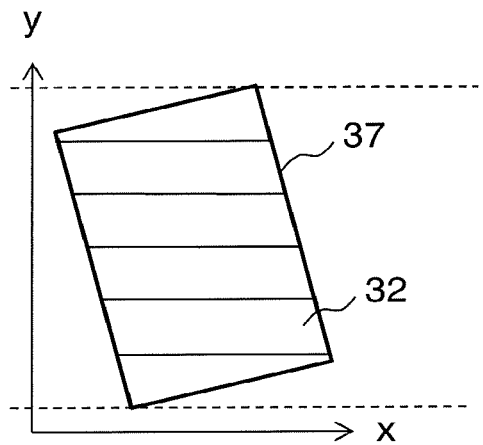
Figure 14C:
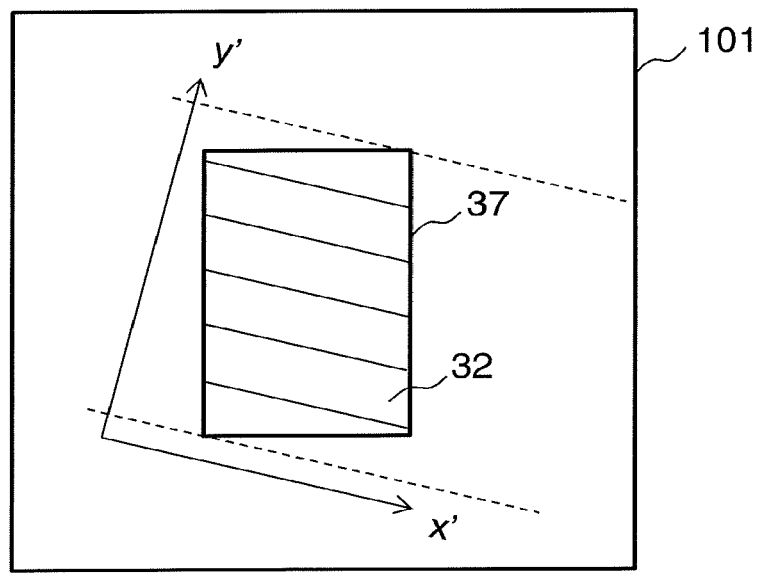

FIGS. 14A to 14C show states of chip regions at respective stages according to the first embodiment. Writing processing is performed for each writing chip pattern to be written. Therefore, chip pattern data is stored, as writing data, in the storage device 140. Then, as shown in FIG. 14A, the data rotation correction unit 58 generates pattern data in which a chip pattern 37 (whole figure pattern) to be written is rotated by the rotational deviation amount θ in the direction opposite to the rotational deviation direction of the aperture array image. For example, preferably, the chip pattern 37 is rotated using the lower left corner as a fulcrum. Since each vertex coordinate is defined in the data of each figure pattern defined by the writing data, it is sufficient to generate data in which each vertex coordinate is rotated using the lower left corner of the chip pattern 37 as a fulcrum, for example. In the case of writing a plurality of chip patterns under the same writing conditions, it suffices to perform processing under those writing conditions after obtaining one chip pattern by merging the plurality of chip patterns. The data of the chip pattern 37, in which rotation correction has been performed, may be temporarily stored in the storage device 142.

The writing control unit 72 (example of dividing circuit) divides the chip pattern 37 which has been rotated (corrected) in the direction reverse to the rotational deviation direction of the aperture array image into a plurality of stripe regions 32, using the x and y axes of the data coordinate system as shown in FIG. 14B. In other words, the writing control unit 72 divides, in the y axis direction not having been rotated, the region of the chip pattern 37 having been rotated (corrected) into a plurality of stripe regions 32 by the width size being substantially the same as the size of the irradiation region 34 (writing field) which can be irradiated with one irradiation of the multiple beams 20. As described above, the x-direction size of the irradiation region 34 can be defined by the value obtained by multiplying the pitch between beams in the x direction of the multiple beams 20 by the number of beams in the x direction. The y-direction size of the irradiation region 34 can be defined by the value obtained by multiplying the pitch between beams in the y direction of the multiple beams 20 by the number of beams in the y direction. The width of the stripe region 32 is not limited to this. Preferably, the width of the stripe region 32 is n times (n being an integer of 1 or greater) the size of the irradiation region 34.

In the rasterizing step (S108), the rasterizing unit 50 performs rasterizing processing using pattern data of the chip pattern 37 (figure pattern) having been rotated in the opposite direction. Specifically, the rasterizing unit 50 reads data of the chip pattern 37 having been rotated (corrected), and calculates, for each pixel 36, a pattern area density ρ' in the pixel 36 concerned. This processing is performed for each stripe region 32, for example.

In the dose calculating step (S110), first, the dose calculation unit 52 virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 μm. The dose calculation unit 52 reads writing data from the storage device 140, and calculates, for each proximity mesh region, a pattern area density p of a pattern arranged in the proximity mesh region concerned.

Next, the dose calculation unit 52 calculates, for each proximity mesh region, a proximity effect correction irradiation coefficient $D_p(x)$ (correction dose) for correcting a proximity effect. An unknown proximity effect correction irradiation coefficient $D_p(x)$ can be defined by a threshold value model for proximity effect correction, which is the same as the one used in a conventional method where a backscatter coefficient η, a dose threshold value Dth of a threshold value model, a pattern area density ρ, and a distribution function g(x) are used.

Next, the dose calculation unit 52 calculates, for each pixel 36, an incident dose D(x) (dose amount) with which the pixel 36 concerned is irradiated. The incident dose D(x) can be calculated, for example, by multiplying a pre-set base dose $D_{base}$, a proximity effect correction irradiation coefficient $D_p$, and a pattern area density ρ'. The base dose $D_{base}$ can be defined by Dth/(½+η), for example. Thereby, it is possible to obtain an originally desired incident dose D(x), for which the proximity effect has been corrected, based on layout of a plurality of figure patterns defined by the writing data.

The dose calculation unit 52 generates an irradiation time data map (1) in which the irradiation time for each pixel 36 is defined by way of converting an incident dose D(x) for each pixel 36 into an irradiation time t by gradation using gray scale levels based on a predetermined quantization unit Δ. The generated irradiation time data map (1) is stored in the storage device 142, for example.

In the irradiation time data processing step (S112), the irradiation time data processing unit 54 reads the irradiation time data map (1), and rearranges it in order of shot in accordance with the writing sequence according to the first embodiment. Then, the irradiation time data processing unit 54 transmits the irradiation time t data to the deflection control circuit 130 in order of shot.

In the writing step (S114), the deflection control circuit 130 outputs a blanking control signal to the blanking aperture array mechanism 204 in order of shot, and a deflection control signal to the DAC amplifier units 132 and 134 in order of shot. The writing mechanism 150 writes a figure pattern on the target object 101 by deflecting, to a desired position on the target object 101, the multiple beams 20 which have passed through the blanking aperture array mechanism 204 and whose aperture array image has a rotational deviation due to residual error of rotation adjustment of the shaping aperture array substrate 331. It is specifically explained below. The blanking aperture array mechanism 204 provides individual blanking control of the multiple beams 20, based on data (pattern data of figure pattern) of a chip pattern having been rotated in the reverse direction. The multiple beams 20 which have passed through the blanking aperture array mechanism 204 and whose aperture array image has a rotational deviation due to residual error of rotation adjustment of the shaping aperture array substrate 331 are deflected to desired positions on the target object 101 by the deflector 208 and the deflector 209. When writing a figure pattern on the target object 101, the stage control circuit 138 moves the XY stage 105 slantwise diagonally by the amount A of rotational deviation of the aperture array image resulting from residual error of rotation adjustment of the shaping aperture array substrate 331 so that the angle of the writing progressing direction may be coincident with the direction of rotational deviation of the aperture array image. Specifically, the stage control circuit 138 inputs information on the moving coordinate system of the XY stage 105 (that is the writing progressing coordinate system) whose x and y axes have been corrected to X' and y' axes, and then, as shown in FIG. 14C, when each stripe region 32 is written, the XY stage 105 is moved diagonally based on the moving coordinate system of the XY stage 105

(that is the writing progressing coordinate system) whose axes have been corrected to x' and y' axes. In other words, the stage 105 is moved in the longitudinal direction of each stripe region 32 whose angle has been rotated due to rotational deviation of the aperture array image caused by residual error of rotation adjustment of the shaping aperture array substrate 331. As a result, the chip pattern 37 to be written on the target object 101 can be written in the state where the rotational deviation of the aperture array image due to residual error of the rotation adjustment of the shaping aperture array substrate 331 has been corrected. According to the first embodiment, since the rotation correction has been performed for the writing data itself, rotation error components do not need to be corrected by way of dose modulation. Therefore, it is possible to avoid or suppress increase in the dose modulation width occurring with correction of rotational deviation. Consequently, it is possible to avoid or suppress increase in the maximum irradiation time occurring with correction of rotational deviation.

As described above, according to the first embodiment, rotation error of a multi-beam image due to error of arrangement angle adjustment of the shaping aperture array substrate 331 for forming the multiple beams 20 can be corrected while inhibiting decrease of throughput.

Embodiments have been explained referring to specific examples described above. However, the present invention is not limited to these specific examples.

While the case of inputting a 10-bit control signal into each control circuit 41 to be controlled has been described above, the number of bits may be suitably set. For example, a 2-bit (or any one of 3 to 9 bit) control signal may be used. Alternatively, a control signal of 11-bits or more may be used.

While the apparatus configuration, control method, and the like not directly necessary for explaining the present invention are not described, some or all of them can be selectively used case-by-case basis. For example, although description of the configuration of the control circuit for controlling the writing apparatus 100 is omitted, it should be understood that some or all of the configuration of the control circuit can be selected and used appropriately when necessary.

In addition, any other multiple charged particle beam writing apparatus and multiple charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam writing apparatus comprising:
    a storage device configured to store writing data defining pattern data on a figure pattern to be written;
    a stage configured to be movable and to mount thereon a target object;
    an emission source configured to emit a charged particle beam;
    a shaping aperture array substrate, in which a plurality of openings are formed, configured to be rotatable and to form and shape multiple beams by letting portions of the charged particle beam individually pass through a corresponding one of the plurality of openings;
    a data rotation correction circuitry configured to read the writing data from the storage device, and, by using information on a rotational deviation amount of an aperture array image of the multiple beams on the target object caused by a residual error of rotation adjustment of the shaping aperture array substrate, to generate pattern data in which a whole of the figure pattern has been rotated in a reverse direction to a rotational deviation direction of the aperture array image by the rotational deviation amount of the aperture array image;
    a blanking aperture array mechanism configured to provide individual blanking control of the multiple beams, based on the pattern data of the figure pattern having been rotated in the reverse direction, and to be rotatable with the shaping aperture array substrate; and
    a deflector configured to deflect the multiple beams which have passed through the blanking aperture array mechanism and whose aperture array image has a rotational deviation caused by the residual error of the rotation adjustment of the shaping aperture array substrate, to desired positions on the target object.

2. The apparatus according to claim 1, further comprising:
    a stage control circuitry configured, in a case of writing the figure pattern on the target object, to move the stage diagonally by the rotational deviation amount of the aperture array image caused by the residual error of the rotation adjustment of the shaping aperture array substrate so that an angle of writing progressing direction is coincident with the rotational deviation direction of the aperture array image.

3. The apparatus according to claim 1, further comprising:
    a rasterizing circuitry configured to perform rasterizing processing using the pattern data of the figure pattern having been rotated in the reverse direction.

4. The apparatus according to claim 1, further comprising:
    a dividing circuitry configured to divide a region of the figure pattern having been rotated in the reverse direction into a plurality of stripe regions, in a predetermined axis direction of a data coordinate system not having been rotated in the reverse direction.

5. The apparatus according to claim 4, wherein the stage is moved in a longitudinal direction of each of the plurality of stripe regions whose angle has been rotated due to the rotational deviation of the aperture array image caused by the residual error of the rotation adjustment of the shaping aperture array substrate.

6. The apparatus according to claim 1, further comprising:
    a stage moving angle correction circuitry configured to perform axis correction of a moving coordinate system of the stage by correcting a first axis to a second axis by rotating an angle of the first axis in the rotational deviation direction of the aperture array image by the rotational deviation amount of the aperture array image.

7. A multiple charged particle beam writing method comprising:
    reading writing data from a storage device which stores the writing data defining pattern data on a figure pattern to be written, and, by using information on a rotational deviation amount of an aperture array image of multiple beams on a target object caused by a residual error of rotation adjustment of a shaping aperture array substrate which is rotatable and forms the multiple beams, generating the pattern data in which a whole of the figure pattern has been rotated in a reverse direction to a rotational deviation direction of the aperture array image by the rotational deviation amount of the aperture array image;

performing individual blanking control of the multiple beams, based on the pattern data of the figure pattern having been rotated in the reverse direction, by using a blanking aperture array mechanism which is rotatable with the shaping aperture array substrate; and writing the figure pattern on the target object by deflecting the multiple beams which have passed through the blanking aperture array mechanism and whose aperture array image has a rotational deviation caused by the residual error of the rotation adjustment of the shaping aperture array substrate, to desired positions on the target object.

8. The method according to claim 7, wherein, in a case of writing the figure pattern on the target object, diagonally moving a stage with the target object placed thereon by the rotational deviation amount of the aperture array image caused by the residual error of the rotation adjustment of the shaping aperture array substrate so that an angle of writing progressing direction is coincident with the rotational deviation direction of the aperture array image.

9. The method according to claim 7, further comprising:
performing rasterizing processing by using the pattern data of the figure pattern having been rotated in the reverse direction.

10. The method according to claim 7, further comprising:
performing axis correction of a moving coordinate system of a stage by correcting a first axis to a second axis by rotating an angle of the first axis in the rotational deviation direction of the aperture array image by the rotational deviation amount of the aperture array image; and diagonally moving the stage with the target object placed thereon, along the second axis corrected of the moving coordinate system of the stage in a case of writing the figure pattern on the target object.

* * * * *